United States Patent
Lee et al.

(10) Patent No.: US 6,552,640 B2
(45) Date of Patent: Apr. 22, 2003

(54) SPACE DEFINING STRUCTURE FOR MAGNETIC HOMOGENIZATION

(76) Inventors: Moon Ho Lee, 102-1305 Youngnam Mansion, Jisan-dong, Susong-gu, 706-090 Taegu-si (KR); Seong Ho Bae, 5-504, Susongdonga, Apt., 789-6 Dusan-dong, Susong-gu, 706-080 Taegu-si (KR)

( * ) Notice: Subject to any disclaimer, the term of this patent is extended or adjusted under 35 U.S.C. 154(b) by 47 days.

(21) Appl. No.: 09/853,621

(22) Filed: May 14, 2001

(65) Prior Publication Data

US 2002/0167383 A1 Nov. 14, 2002

(51) Int. Cl.$^7$ ................................................ H01F 7/02
(52) U.S. Cl. ....................................... 335/306; 335/302
(58) Field of Search ............................... 335/216, 299, 335/302–306

(56) References Cited

U.S. PATENT DOCUMENTS

| | | | | |
|---|---|---|---|---|
| 4,859,976 A | * | 8/1989 | Leupold | 335/306 |
| 4,893,103 A | * | 1/1990 | Leupold | 335/216 |
| 5,506,558 A | * | 4/1996 | Laube | 335/306 |

* cited by examiner

Primary Examiner—Lincoln Donovan
(74) Attorney, Agent, or Firm—McGuireWoods LLP

(57) ABSTRACT

A space defining structure for magnetic homogenization is disclosed. The space defining structure of this invention is specifically designed to homogenize the magnetic field within its interior space, thus minimizing a malfunctioning or damage of electronic equipment or ill-effect on living matters within houses and buildings due to a localized geomagnetic disturbance. Such a localized geomagnetic disturbance may be generated by a variety of magnetic structures, such as the interior structures of the earth's crust, for example, stratum structures, underground water and water veins, a variety of magnetic materials, a variety of electronic devices or the reinforcing bars of the houses or buildings. The space defining structure for magnetic homogenization of this invention consists of a magnetic field focusing member 1 forming the bottom wall of the space structure. The space defining structure also has at least one magnetic field dispersing member 2 extending from the magnetic field focusing member 1 while defining the desired interior space of the structure in cooperation with the magnetic field focusing member 1.

6 Claims, 10 Drawing Sheets

SPACE DEFINING STRUCTURE FOR MAGNETIC HOMOGENIZATION

TECHNICAL FIELD

The present invention relates, in general, to space defining structures for magnetic homogenization and, more particularly, to a space defining structure specifically designed to homogenize the magnetic field within its interior space, thus minimizing a malfunctioning or damage of electronic equipment or ill-effect on living matters within houses and buildings due to a localized geomagnetic disturbance, with such a localized geomagnetic disturbance generated by a variety of magnetic structures, such as the interior structures of the earth's crust, for example, stratum structures, underground water and water veins, a variety of magnetic materials, a variety of electronic devices or the reinforcing bars of houses or buildings.

BACKGROUND ART

As well known to those skilled in the art, geomagnetism is the earth's magnetic field and associated phenomena and is determined by both the exterior geo-current, caused by solar activity, and the interior geo-current caused by core activity, or the activity of the central portion of the earth. When solar wind, formed by sunspot activity or coronal activity of the sun, reaches the earth, a geomagnetic storm is formed on the earth and disturbs the ionospheric layer of the earth, and changes the external geo-current. Such a change in the external geo-current due to solar wind finally causes a geomagnetic disturbance. Such a geomagnetic disturbance also may be generated when localized geomagnetic characteristics fail to be homogenized due to the interior structures of the earth's crust, for example, stratum structures, underground minerals, petroleum layers, natural gas layers, underground water and water veins. Particularly, when localized geomagnetic permeability fails to accomplish a desired homogenization, it is almost impossible to homogenize the distribution of the geomagnetic flux density. This finally generates a localized geomagnetic disturbance.

In addition, houses, buildings or other reinforced concrete structures, including reinforcing bars, cause a localized geomagnetic disturbance due to the ferromagnetic reinforcing bars. Particularly, conventional steel frame construction buildings exceedingly disturb the geomagnetism, with some of such buildings forming a high intensity of magnetic field having a magnetic flux density of 2.5 gauss or higher.

Such a geomagnetic disturbance undesirably causes a malfunctioning or damage of electronic equipment or ill-effect on living matters within such houses and buildings. That is, most electronic equipment, such as computers, electronic watches and a variety of electronic measuring instruments, arranged in a space affected by the geomagnetic disturbance may be easily damaged or malfunction since the electrons are affected by the Lorentz force and are undesirably distorted in their activity when the electrons are included in the strong magnetic field formed by such a geomagnetic disturbance. In addition, the activity of living matters, such as animals, is reduced in such a space affected by the disturbed magnetic field.

Different from the electric field, it is impossible to shield the line of magnetic force within a magnetic field free from an electric field. However, the line of magnetic force within such a magnetic field free from the electric field may be preferably shielded by superconductors (diamagnetic materials), ferromagnetic materials or softmagnetic materials used as the shielding material for the line of magnetic force.

That is, when superconductors are appropriately arranged in a magnetic field to shield a target space within the magnetic field, the superconductors do not allow the line of magnetic force to pass through, and so the target space is free from the line of magnetic force. It is thus possible to shield the magnetic field free from the electric field.

However, the conventional method of shielding the line of magnetic force within a magnetic field free from an electric field is problematic in that it necessarily uses very expensive superconductors and always maintains a cryotemperature, or an ultra low temperature, so as to retain the desired superconductivity, thus increasing the maintenance cost of the magnetic field shielding system. For example, in the case of using metal superconductors as the magnetic field shielding material, it is necessary to maintain the system temperature at a liquid helium temperature, or $4.2°$ K. On the other hand, when ceramic high critical temperature superconductors are used as the magnetic field shielding material, it is necessary to maintain the system temperature at a liquid nitrogen temperature, or $198°$ K.

DISCLOSURE OF THE INVENTION

Accordingly, the present invention has been made keeping in mind the above problems occurring in the prior art, and an object of the present invention is to provide a space defining structure for magnetic homogenization, which is specifically designed to homogenize the magnetic field within its interior space by effectively shielding the localized geomagnetic disturbance generated by a variety of magnetic substances, thus accomplishing a desired magnetic homogenization.

In order to accomplish the above object, the inventor of this invention repeatedly performed a plurality of experiments for fabricating an appropriate space defining structure for magnetic homogenization on the basis of the fact that it is possible to bypass focused lines of magnetic force to the exterior of the structure through a bypass path while partially and preferably shielding the magnetic field within a target space, requiring a magnetic field shielding structure, when the lines of magnetic force are focused to a point using both a ferromagnetic material and a softmagnetic material with the bypass path being formed outside the target space. The above experiments were performed with a plurality of magnetic field shielding structures, which used specifically selected magnetic materials capable of focusing the lines of magnetic force to a point, a variety of shapes of magnetic field focusing members, and a variety of shapes of bypass paths for the focused lines of magnetic force. From such experiments, the inventor of this invention finally realizes that it is possible to homogenize the distribution of magnetic field within such a target space by both an appropriate selection of specified magnetic materials for magnetic field focusing and dispersing members and an appropriate arrangement of the magnetic field focusing and dispersing members made of such appropriately selected magnetic materials. The space defining structure for magnetic homogenization of this invention is accomplished from the above-mentioned technical base.

This invention thus finally provides a space defining structure for magnetic homogenization, which is designed to homogenize the magnetic field within its interior space by shielding a localized geomagnetic disturbance generated by a variety of magnetic structures, such as the interior structures of the earth's crust, for example, stratum structures, underground minerals, underground water and water veins, a variety of magnetic materials, a variety of electronic devices or the reinforcing bars of the houses or buildings. The structure of this invention thus accomplishes a desirably homogenized distribution of geomagnetic flux density.

The space defining structure of this invention comprises a magnetic field focusing member forming the bottom wall of the space defining structure, with at least one magnetic field dispersing member extending from the magnetic field focusing member while defining a desired interior space of the structure in cooperation with the magnetic field focusing member. In the above structure, the magnetic field focusing member is made of a material including a magnetic material, having a magnetic permeability of not less than 10 Wb/A*m, an intensity of coercive magnetic field of not higher than 1.0 oersted (Oe), a saturated magnetic flux density of not less than 10 gauss, and a Curie point of not lower than 50° C. under the condition of a temperature range of −50° C.~+150° C. On the other hand, the magnetic field dispersing member is made of a material including a magnetic material, having a magnetic permeability of 1.2~1,000,000 Wb/A*m under the condition of a temperature range of −50° C.~+150° C.

In a detailed description, the space defming structure for magnetic homogenization of this invention is fabricated using a magnetic field focusing member forming the bottom wall of the space defining structure, with at least one magnetic field dispersing member extending from the magnetic field focusing member while defining the desired interior space of the structure in cooperation with the magnetic field focusing member.

In the above space defining structure of this invention, the magnetic field focusing member focuses the lines of magnetic force, while the magnetic field dispersing member disperses the focused lines of magnetic force by bypassing the focused lines of magnetic force from the interior space of the structure defined by both the magnetic field focusing member and the magnetic field dispersing member into the outside of the structure, thus accomplishing a desired magnetic homogenization within the interior space of the structure.

In this space defining structure, the magnetic field focusing member and the magnetic field dispersing member are preferably fabricated with each other into a structure of a tetrahedral shape, a hexahedral shape, an octahedral shape, a cylindrical shape or a dome shape. However, it should be understood that the shape of the resulting structure may be somewhat freely changed from the above-mentioned shapes without affecting the functioning of this invention.

In addition, at least one opening is preferably formed on the sidewall and/or the top wall of the space defining structure of this invention. In the space defining structure with such an opening, the focused lines of magnetic force are effectively bypassed from the interior space of the structure into the outside of the structure through the opening, and so the structure more effectively shields the lines of magnetic force and more effectively homogenizes the magnetic field distribution.

In the space defining structure of this invention, the object of the magnetic field focusing member is to shield a localized geomagnetic disturbance generated by a variety of magnetic structures, such as the interior structures of the earth's crust, for example, stratum structures, underground minerals, underground water and water veins, a variety of magnetic materials, a variety of electronic devices or the reinforcing bars of the houses or buildings. Such an operational effect of the magnetic field focusing member is accomplished by the characteristics of its materials. In order to allow the magnetic field focusing member of this structure to accomplish such a desired operational function, the material of the magnetic field focusing member necessarily includes a magnetic material, having a magnetic permeability of not less than 10 mWb/A*m, an intensity of coercive magnetic field of not higher than 1.0 oersted (Oe), a saturated magnetic flux density of not less than 10 gauss, and a Curie point of not lower than 50° C. under the condition of a temperature range of −50° C.~+150° C. The magnetic material, included in the magnetic field focusing member, is preferably selected from the group consisting of Fe, Fe—Si, permalloys, super-permalloys, permendurs, mumetals, moly-permalloys, MnZn ferrites, NiZn ferrites, CuZn ferrites and garnet-type ferrites, and mixtures thereof. In addition, the material of the magnetic field focusing member preferably consists of the magnetic material or a mixture formed by mixing the magnetic material with another material. The material, mixed with the magnetic material into the mixture for the magnetic field focusing member, may be at least one selected from the group consisting of paper, rubber, cloth, cement, lime, sand, plastic, glue, wood and adhesive agent. However, it should be understood that the material, mixed with the magnetic material into the mixture for the magnetic field focusing member, is not limited to the above-mentioned materials. The magnetic field focusing member of this structure may have a variety of shapes. That is, the magnetic field focusing member may have a plate-type, sheet-type, film-type, wall paper-type, net-type, rod-type or tile-type shape, or may be applied with a powder- or paint-phase material thereon.

On the other hand, the object of the magnetic field dispersing member is to disperse the magnetic field, previously focused by the magnetic field focusing member, thus accomplishing a desired magnetic homogenization within the interior space of the structure defined by both the magnetic field focusing member and the magnetic field dispersing member. In order to allow the magnetic field dispersing member to accomplish the above-mentioned operational function, the material of the magnetic field dispersing member necessarily includes a magnetic material, having a magnetic permeability of 1.2~1,000,000 Wb/A*m under the condition of a temperature range of −50° C.~+150° C. The magnetic material, included in the magnetic field dispersing member, is selected from the group consisting of Fe, Fe—Si, permalloys, super-permalloys, permendurs, mumetals, moly-permalloys, MnZn ferrites, NiZn ferrites, CuZn ferrites and garnet-type ferrites, and mixtures thereof In addition, the material of the magnetic field dispersing member preferably consists of the magnetic material or a mixture formed by mixing the magnetic material with another material. The material, mixed with the magnetic material into the mixture for the magnetic field dispersing member, may be at least one selected from the group consisting of paper, rubber, cloth, cement, lime, sand, plastic, glue, wood and adhesive agent. However, it should be understood that the material, mixed with the magnetic material into the mixture for the magnetic field dispersing member, is not limited to the above-mentioned materials. On the other hand, the magnetic field dispersing member of this structure may have a variety of shapes. That is, the magnetic field dispersing member may have a plate-type, sheet-type, film-type, wall paper-type, net-type, rod-type or tile-type shape, or may be applied with a powder- or paint-phase material thereon.

When such a space defining structure is made of aluminum or copper, the resulting structure completely fails to accomplish a desired magnetic homogenization. On the other hand, when the space defining structure is made of a ferromagnetic steel plate, the resulting structure does not accomplish a desired homogenized magnetic field distribution, but forms a new magnetic field distribution, thus undesirably allowing the magnetic field distribution within the structure to become more uneven.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
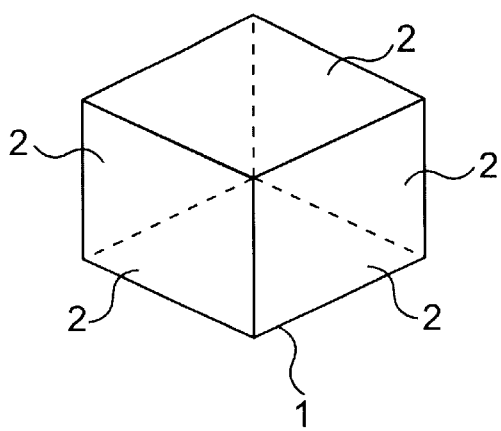
FIG. 1 is a view of a space defining structure for magnetic homogenization in accordance with the primary embodiment of the present invention.
Figure 2:
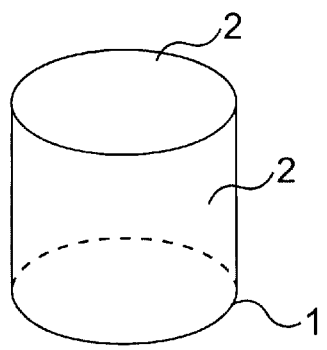
FIG. 2 is a view of a space defining structure for magnetic homogenization in accordance with the second embodiment of the present invention.
Figure 3:
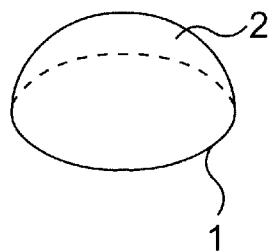
FIG. 3 is a view of a space defining structure for magnetic homogenization in accordance with the third embodiment of the present invention.

FIG. 1 is a view of a space defining structure for magnetic homogenization in accordance with the primary embodiment of this invention. This space defining structure has a hexahedral shape, with one magnetic field focusing member 1 forming the bottom wall of the structure and five magnetic field dispersing members 2 forming the four sidewalls and the top wall of the structure. FIG. 2 is a view of a space defining structure for magnetic homogenization in accordance with the second embodiment of this invention, which has a cylindrical shape with one magnetic field focusing member 1 forming the bottom wall of the structure and two magnetic field dispersing members 2 forming the sidewall and the top wall of the structure. FIG. 3 is a view of a space defining structure for magnetic homogenization in accordance with the third embodiment of this invention, which is a hemispherical shape with one magnetic field focusing member 1 forming the bottom wall of the structure and one magnetic field dispersing member 2 forming the dome of the structure.

FIGS. 4 to 19 are views, showing space defining structures for magnetic homogenization in accordance with the fourth to nineteenth embodiments of the present invention, with at least one opening 3 being formed on the sidewall and/or the top wall of each of the space defining structures.

Figure 4:
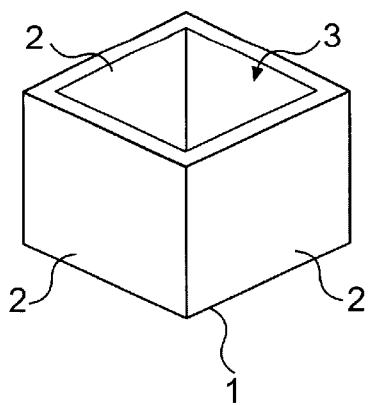
FIG. 4 is a view of a space defining structure for magnetic homogenization in accordance with the fourth embodiment of the present invention.
Figure 5:
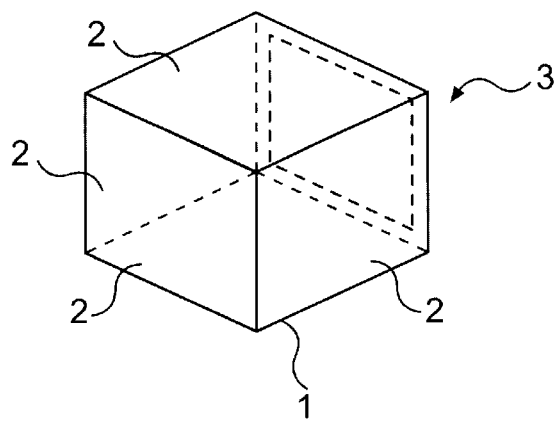
FIG. 5 is a view of a space defining structure for magnetic homogenization in accordance with the fifth embodiment of the present invention.
Figure 6:
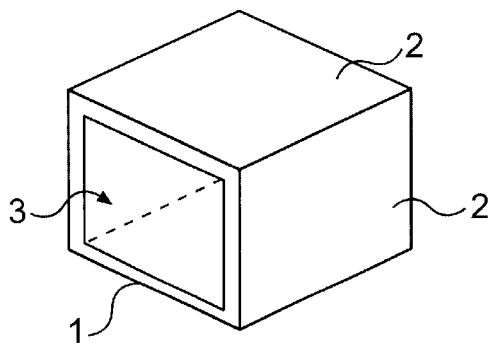
FIG. 6 is a view of a space defining structure for magnetic homogenization in accordance with the sixth embodiment of the present invention.
Figure 7:
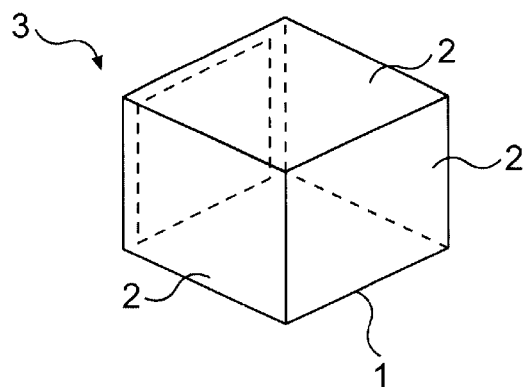
FIG. 7 is a view of a space defining structure for magnetic homogenization in accordance with the seventh embodiment of the present invention.
Figure 8:
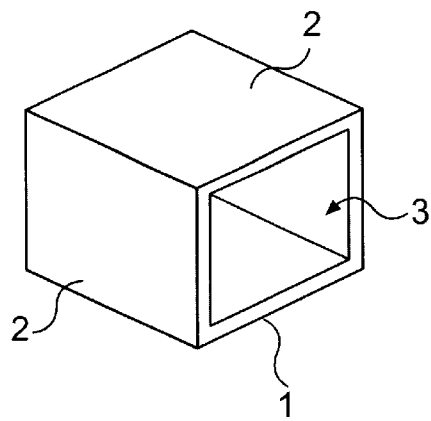
FIG. 8 is a view of a space defining structure for magnetic homogenization in accordance with the eighth embodiment of the present invention.

FIG. 4 shows a hexahedral space defining structure for magnetic homogenization having an opening 3 on its top wall in accordance with the fourth embodiment of this invention. FIGS. 5 to 8 show hexahedral space defining structures for magnetic homogenization in accordance with the fifth to eighth embodiments of this invention, individually having an opening 3 on one sidewall thereof.

Figure 9:
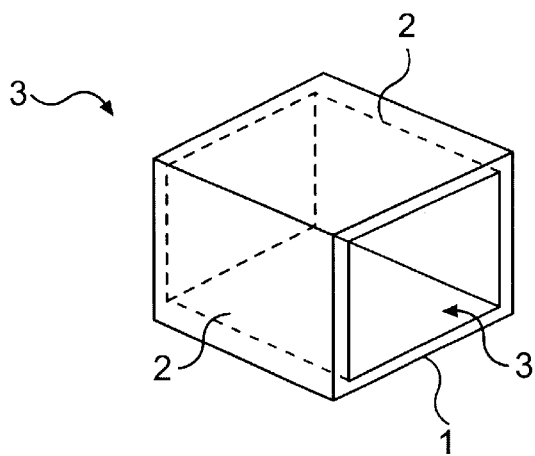
FIG. 9 is a view of a space defining structure for magnetic homogenization in accordance with the ninth embodiment of the present invention.
Figure 10:
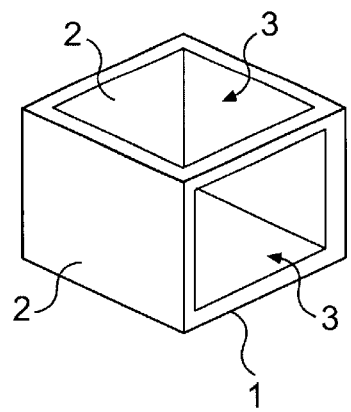
FIG. 10 is a view of a space defining structure for magnetic homogenization in accordance with the tenth embodiment of the present invention.

FIG. 9 shows a hexahedral space defining structure for magnetic homogenization having two openings 3 on two opposite sidewalls in accordance with the ninth embodiment of this invention. FIG. 10 shows a hexahedral space defining structure for magnetic homogenization having two openings 3 on one sidewall and the top wall thereof in accordance with the tenth embodiment of this invention.

Figure 11:
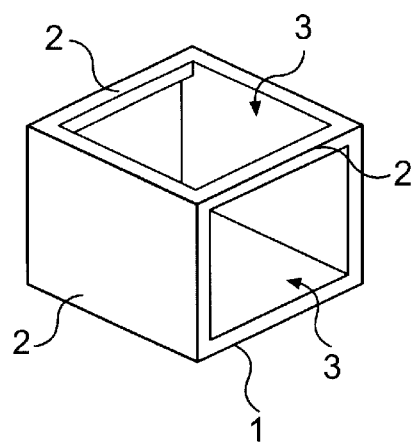
FIG. 11 is a view of a space defining structure for magnetic homogenization in accordance with the eleventh embodiment of the present invention.
Figure 12:
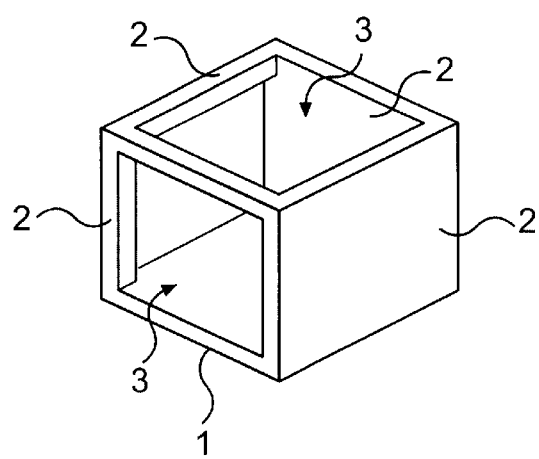
FIG. 12 is a view of a space defining structure for magnetic homogenization in accordance with the twelfth embodiment of the present invention.

FIG. 11 shows a hexahedral space defining structure for magnetic homogenization having three openings 3 on two opposite sidewalls and the top wall in accordance with the eleventh embodiment of this invention. FIG. 12 shows a hexahedral space defining structure for magnetic homogenization having three openings 3 on two neighboring sidewalls and the top wall thereof in accordance with the twelfth embodiment of this invention.

Figure 13:
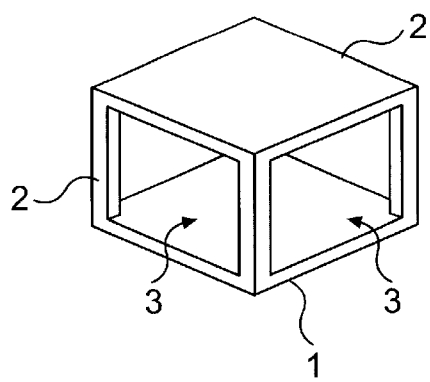
FIG. 13 is a view of a space defining structure for magnetic homogenization in accordance with the thirteenth embodiment of the present invention.
Figure 14:
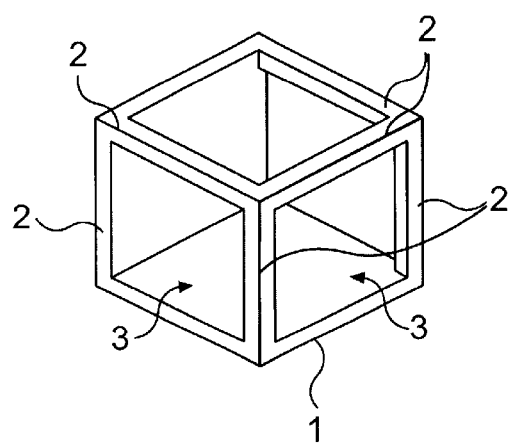
FIG. 14 is a view of a space defining structure for magnetic homogenization in accordance with the fourteenth embodiment of the present invention.

FIG. 13 shows a hexahedral space defining structure for magnetic homogenization having four openings 3 on the four sidewalls in accordance with the thirteenth embodiment of this invention. FIG. 14 shows a hexahedral space defining structure for magnetic homogenization having four openings 3 on three sidewalls and the top wall thereof in accordance with the fourteenth embodiment of this invention.

Figure 15:
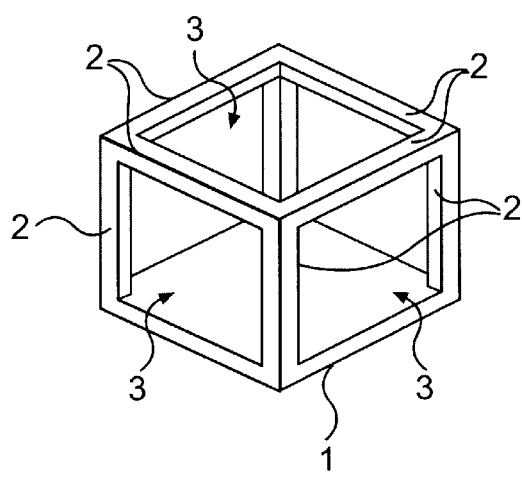
FIG. 15 is a view of a space defming structure for magnetic homogenization in accordance with the fifteenth embodiment of the present invention.
Figure 16:
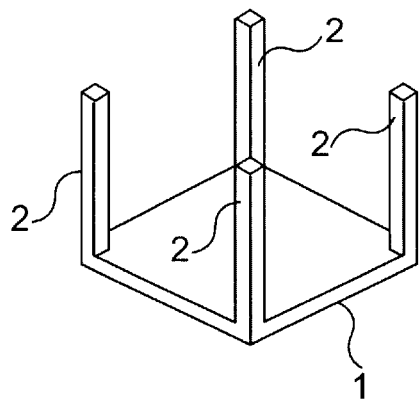
FIG. 16 is a view of a space defining structure for magnetic homogenization in accordance with the sixteenth embodiment of the present invention.

FIG. 15 shows a hexahedral space defining structure for magnetic homogenization having five openings 3 on the four sidewalls and the top wall thereof in accordance with the fifteenth embodiment of this invention. FIG. 16 shows a space defining structure for magnetic homogenization in accordance with the sixteenth embodiment of this invention. This structure consists of one rectangular magnetic field focusing member 1 forming a bottom wall, and four vertical column-shaped magnetic field dispersing members 2 having the same height and standing on the four corners of the rectangular focusing member 1. In this structure, five openings 3 are formed on the four sidewalls and the top wall.

Figure 17:
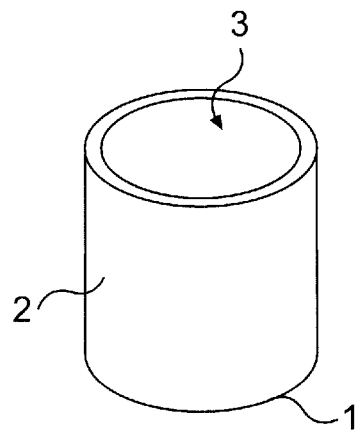
FIG. 17 is a view of a space defining structure for magnetic homogenization in accordance with the seventeenth embodiment of the present invention.
Figure 18:
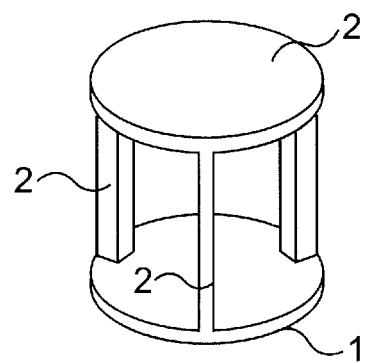
FIG. 18 is a view of a space defining structure for magnetic homogenization in accordance with the eighteenth embodiment of the present invention.
Figure 19:
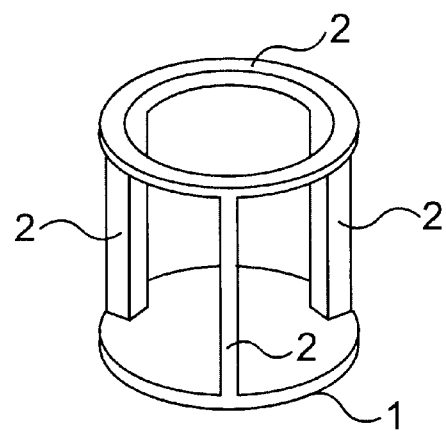
FIG. 19 is a view of a space defining structure for magnetic homogenization in accordance with the nineteenth embodiment of the present invention.

FIG. 17 shows a cylindrical space defining structure for magnetic homogenization having one opening 3 on its top wall in accordance with the seventeenth embodiment of this invention. FIG. 18 shows a space defining structure for magnetic homogenization in accordance with the eighteenth embodiment of this invention. This structure consists of one circular magnetic field focusing member 1 forming a bottom wall, three vertical column-shaped magnetic field dispersing members 2 having the same height and regularly standing on the edge of the circular focusing member 1, and one circular magnetic field dispersing member 2 having the same shape and size as those of the focusing member 1 and mounted to the top ends of the three dispersing members 2. In this structure, three openings 3 are regularly formed on the sidewall. FIG. 19 shows a space defining structure for magnetic homogenization in accordance with the nineteenth embodiment of this invention. In this nineteenth embodiment, the general shape of the space defining structure remains the same as that described for the embodiment of FIG. 18, but an additional circular opening 3 is formed on the top wall, or on the circular magnetic field dispersing member 3, in addition to the three openings 3 formed on the sidewall.

Of course, it should be understood that the formation of the opening(s) 3 on the space defining structure of this invention may be somewhat freely altered from the above-mentioned embodiments without affecting the functioning of this invention. That is, it is possible to form one or more openings 3 having a variety of profiles on the sidewall and/or the top wall of the space defining structure except for the bottom wall.

In the space defining structure of this invention, the magnetic homogenization effect varies in accordance with the thickness of the magnetic field focusing members and the magnetic field dispersing members. Therefore, when it is desired to accomplish a complete magnetic homogenization effect, it is necessary to precisely measure both the intensity of magnetic field and the magnetic flux density within the space that is to be provided with the space defining structure of this invention. In order to accomplish such a complete magnetic homogenization effect, it is also necessary to precisely measure the magnetic permeability of the magnetic field focusing and dispersing members. When the above-mentioned requirements are accomplished, it is possible to determine the optimal thickness and the optimal cross-sectional areas of the focusing and dispersing members. Therefore, when the magnetic field distribution within a space is not homogenized, the magnetic field focusing and dispersing members have to be accurately positioned after the distribution and direction of the lines of magnetic force within the space are precisely calculated.

Figure 20:
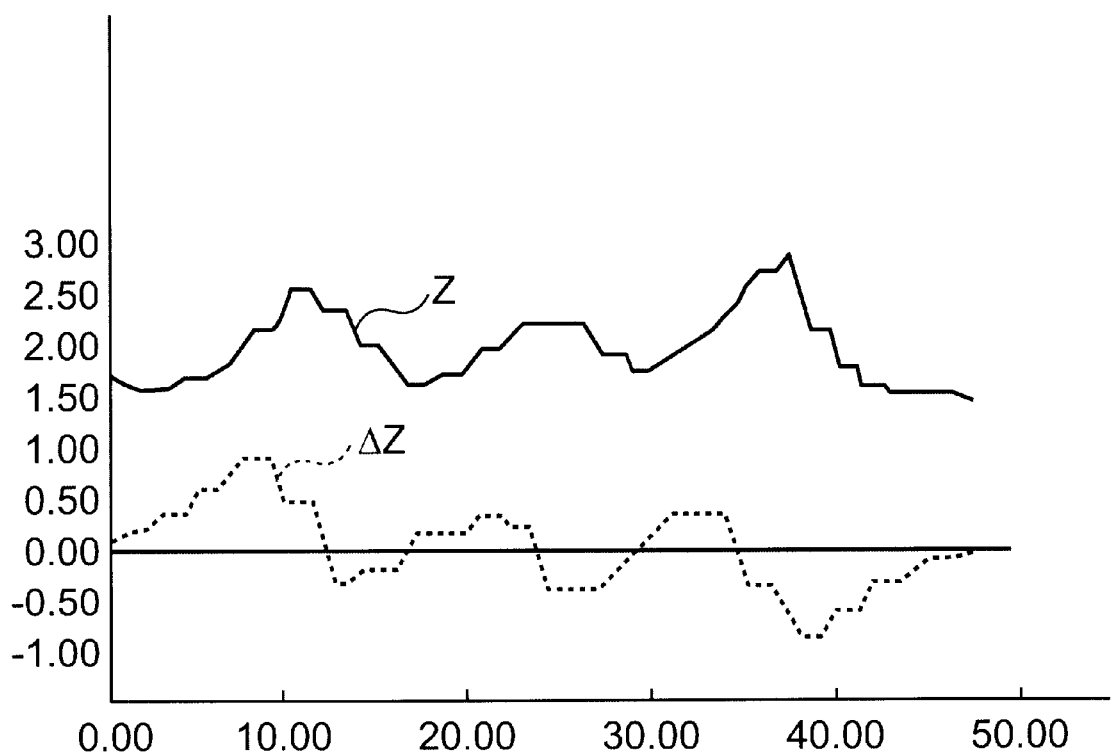
FIG. 20 is a diagrammatic view, showing the characteristic of a disturbed geomagnetic distribution measured by a gaussmeter.
Figure 21:
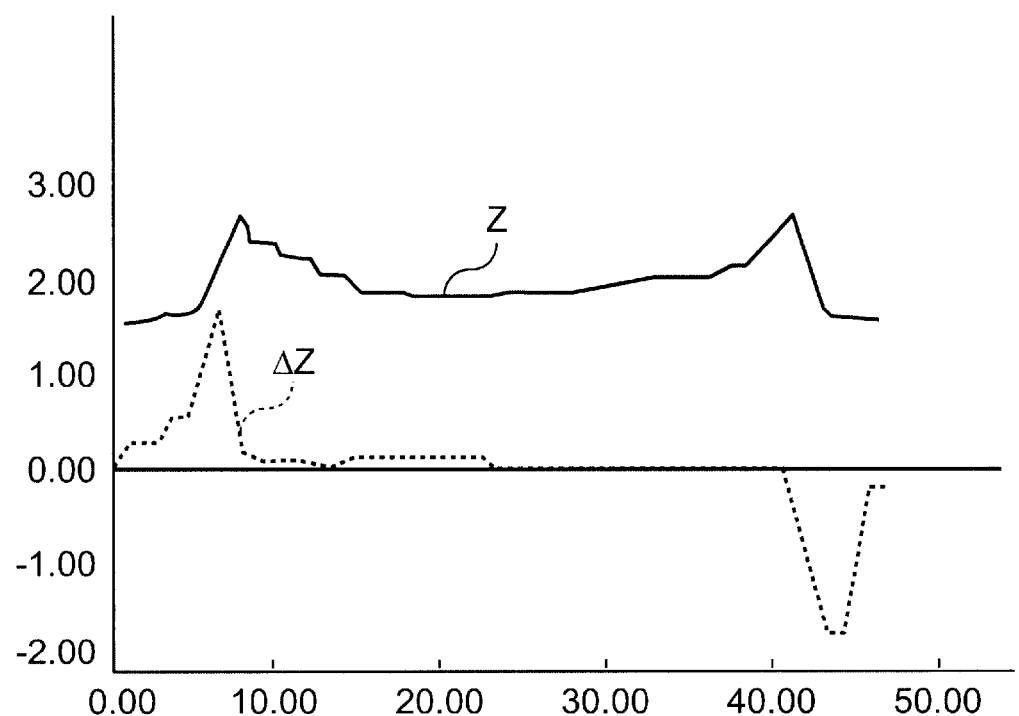
FIG. 21 is a diagrammatic view, showing the characteristic of a geomagnetic distribution measured by a gaussmeter when a plate-type magnetic field focusing member, having a magnetic permeability of 3,000 Wb/A*m, is arranged in a magnetically disturbed space.
Figure 22:
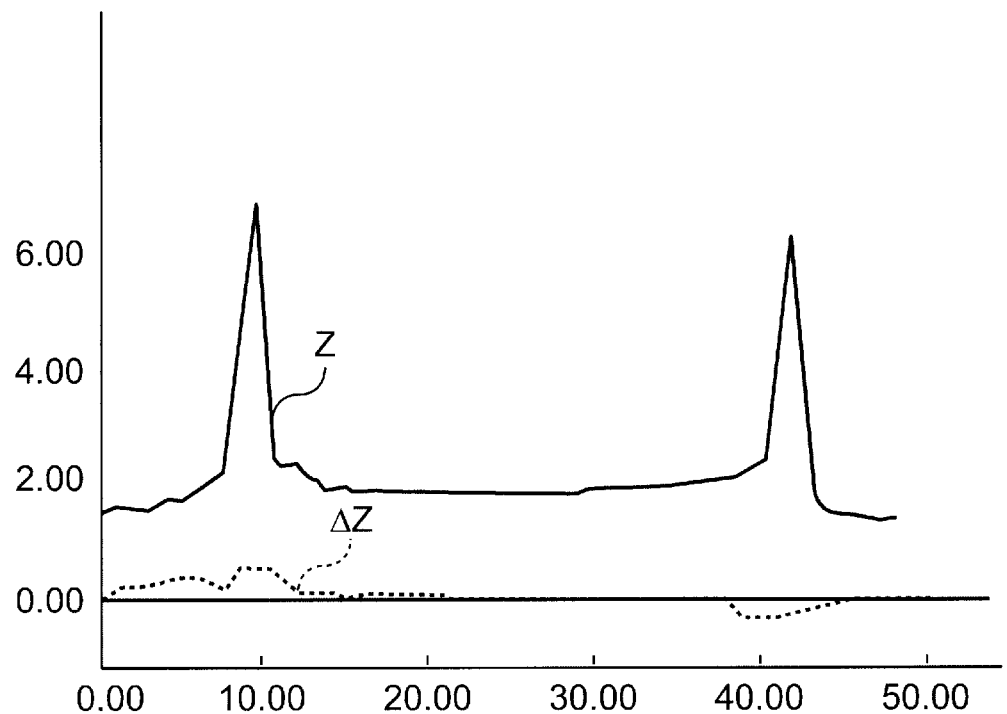
FIG. 22 is a diagrammatic view, showing the characteristic of a geomagnetic distribution measured by a gaussmeter when the space defining structure of FIG. 4, consisting of a bottom wall formed by a plate-type magnetic field focusing member having a magnetic permeability of 3,000 Wb/A*m with a wall paper-type magnetic field dispersing member having a magnetic permeability of 5 Wb/A*m and defining the interior space of the space defining structure in cooperation with the magnetic field focusing member, is arranged in a magnetically disturbed space.

FIGS. 20 to 22 are diagrammatic views, each showing the characteristic of a distribution of the lines of magnetic force measured by a gaussmeter. In these diagrammatic views, the X-axis denotes the horizontal length of the space defining structure, the Y-axis denotes the magnetic flux density, the Z-axis denotes the vertical component of geomagnetism, and $\Delta Z$ denotes the variation ratio of the vertical component of the geomagnetism.

FIG. 20 is a diagrammatic view, showing the characteristic of disturbed geomagnetic distribution within a magnetically disturbed space measured by a gaussmeter, with the space being free from a space defining structure of this invention. FIG. 21 is a diagrammatic view, showing the characteristic of a geomagnetic distribution measured by a gaussmeter when a magnetic field focusing member is positioned on the bottom of the magnetically disturbed space. FIG. 22 is a diagrammatic view, showing the characteristic of a geomagnetic distribution measured by a gaussmeter when the space defining structure of FIG. 4 is positioned in the magnetically disturbed space. When comparing the diagrammatic views with each other, it is possible to realize that the structures of this invention accomplish a desired magnetic homogenization effect.

Figure 23:
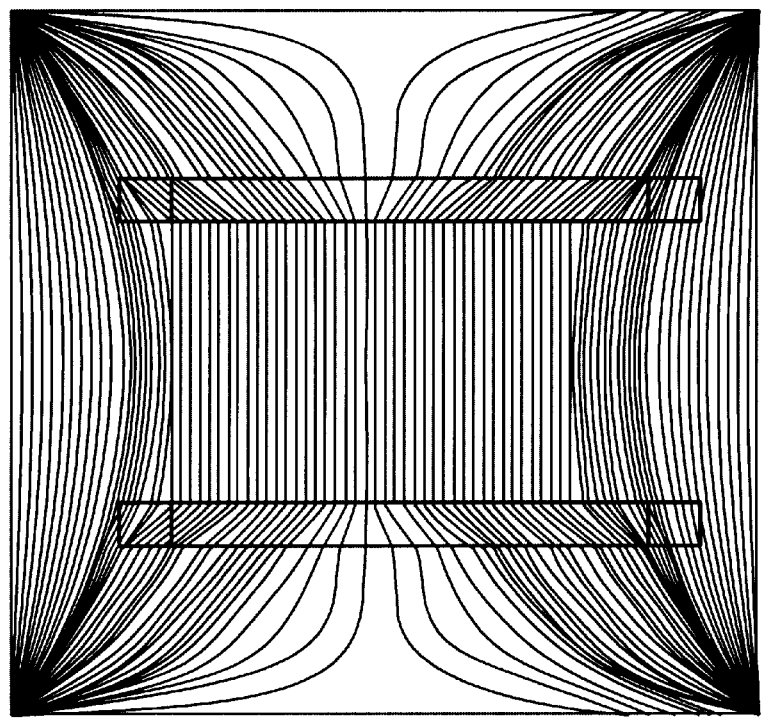
FIG. 23 is a view, showing a homogenized magnetic field within the interior space of a cuboidal space defining structure arranged in a magnetically disturbed space during a simulation test of this invention.
Figure 24:
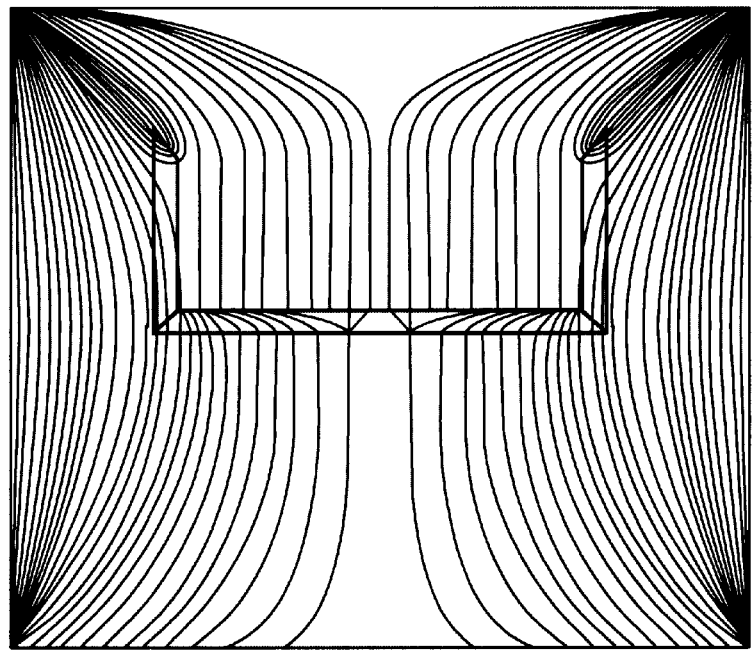
FIG. 24 is a view, showing a homogenized magnetic field in the interior space of a cuboidal space defining structure arranged in a magnetically disturbed space during a simulation test of this invention, with the structure being opened at its top wall.
Figure 25:
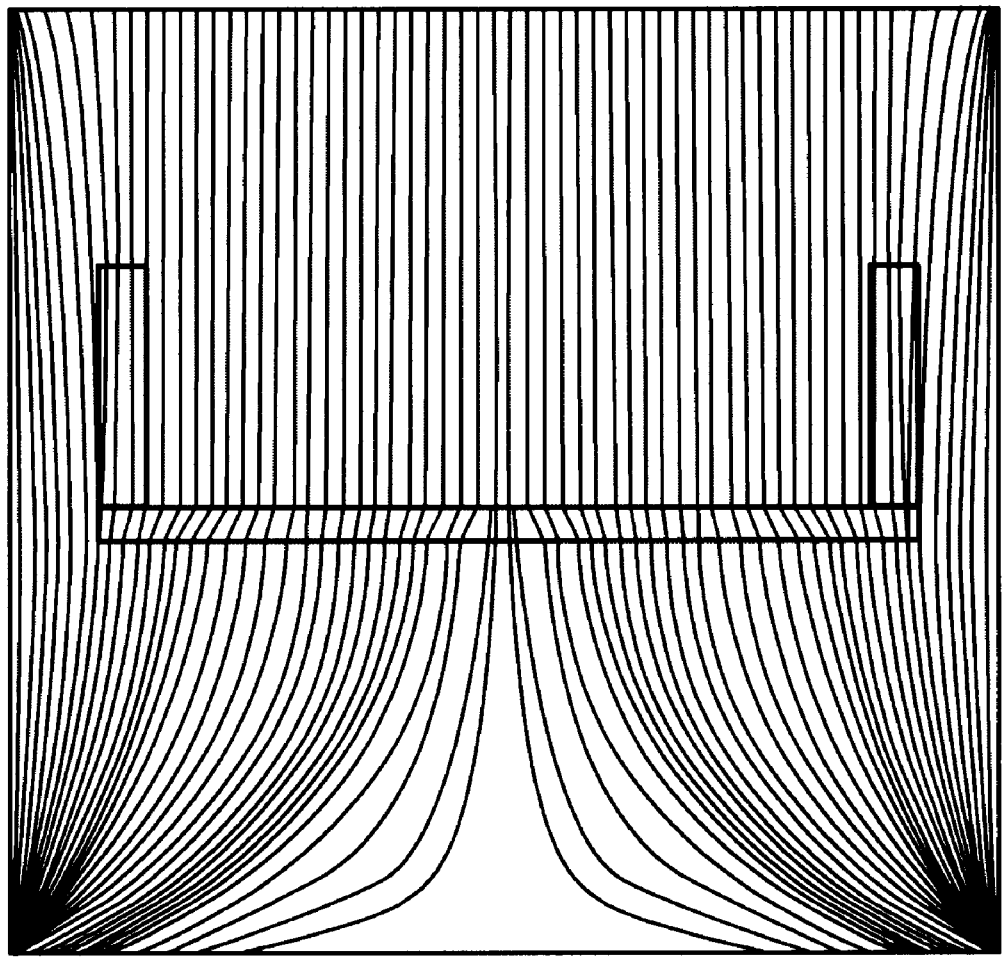
FIG. 25 is a view, showing a homogenized magnetic field in the interior space of a space defining structure arranged in a magnetically disturbed space during a simulation test of this invention, with the space defining structure having a flat rectangular bottom wall and four vertical columns standing on the four corners of the bottom wall.

The simulation tests of FIGS. 23 to 25 show that the structures of this invention accomplish a desired magnetic homogenization effect within the interior of them when the structures are positioned within magnetically disturbed spaces. That is, the above drawings show that the magnetic flux density is not homogenized in the exterior of the structures of this invention different from the interior of the structures wherein the magnetic flux density is completely homogenized.

The inventor of this invention performed an experiment for practically measuring an effect on living matters due to a localized geomagnetic disturbance with a tame rabbit kept in a space, magnetically disturbed by 1.5 gauss and free from a space defining structure of this invention, for 72 hours and in the same space, provided with the structure of this invention, for the same time. In the above experiment, the rabbit was more prominently reduced in activity, was short of breath (hard breathing) and was increased almost double in the TBARS value (the lipid peroxide value or an index of the symptoms of senility) of liver in the case of the magnetically disturbed space free from the structure of this invention rather than the case of using the structure of this invention in the space. Similar experimental results were obtained from an experiment with a mouse.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, the present invention provides a space defining structure for magnetic homogenization, which is specifically designed to desirably homogenize the geomagnetic field in addition to desirably reducing a localized geomagnetic disturbance. That is, the space defining structure of this invention effectively and appropriately reduces the vertical components of the geomagnetic disturbance within any space, such as a limited space or a large space, regardless of the shape of the space, thus finally minimizing a malfunctioning or damage of electronic equipment or ill-effect on living matters within such a space due to the geomagnetic disturbance.

INDUSTRIAL APPLICABILITY

The space defining structure for magnetic homogenization of this invention may be effectively and preferably used with all items affected by geomagnetism. That is, the space defining structure of this invention may be preferably used with interior furniture, such as beds, in addition to houses, buildings and etc. It is possible for people to have a good sleep within an interior space provided with the space defining structure of this invention. This space defining structure also minimizes a malfunctioning or damage of electronic equipment within houses or buildings due to a geomagnetic disturbance.

What is claimed is:

1. A space defining structure for magnetic homogenization designed to homogenize the magnetic field within its interior space by shielding a localized geomagnetic disturbance generated by a variety of magnetic structures, such as the interior structures of the earth's crust, for example, stratum structures, underground minerals, underground water and water veins, a variety of magnetic materials, a variety of electronic devices or the reinforcing bars of the houses or buildings, thus accomplishing a homogenized distribution of geomagnetic flux density, comprising:

a magnetic field focusing member 1 forming a bottom wall of said space defining structure, with at least one magnetic field dispersing member 2 extending from said magnetic field focusing member 1 while defining a desired interior space of the structure in cooperation with the magnetic field focusing member 1, whereby said magnetic field focusing member is made of a material including a magnetic material, said magnetic material having a magnetic permeability of not less than 10 Wb/A*m, an intensity of coercive magnetic field of not higher than 1.0 Oe (oersted), a saturated magnetic flux density of not less than 10 gauss, and a Curie point of not lower than 50° C. under the condition of a temperature range of −50° C.~+150° C., and said magnetic field dispersing member is made of a material including a magnetic material, said magnetic material having a magnetic permeability of 1.2~1,000,000 Wb/A*m under the condition of a temperature range of −50° C.~+150° C.

2. The space defining structure according to claim 1, wherein at least one opening 3 is formed on a sidewall and/or a top wall of said space defining structure.

3. The space defining structure according to claim 1, wherein the magnetic material, included in said magnetic field focusing member and/or said magnetic field dispersing member, is selected from the group consisting of Fe, Fe—Si, permalloys, super-permalloys, permendurs, mumetals, moly-permalloys, MnZn ferrites, NiZn ferrites, CuZn ferrites and garnet-type ferrites, and mixtures thereof.

4. The space defining structure according to claim 1, wherein said magnetic field focusing member and/or said magnetic field dispersing member has a plate-type, sheet-type, film-type, wall paper-type, net-type, rod-type or tile-type shape, or is applied with a powder- or paint-phase material thereon.

5. The space defining structure according to claim 1, wherein said material of the magnetic field focusing member and/or the magnetic field dispersing member consists of the magnetic material or a mixture formed by mixing said magnetic material with at least one selected from the group consisting of paper, rubber, cloth, cement, lime, sand, plastic, glue, wood and adhesive agent.

6. The space defining structure according to claim 1, wherein said magnetic field focusing member and said magnetic field dispersing member are fabricated with each other into a structure of a tetrahedral shape, a hexahedral shape, an octahedral shape, a cylindrical shape or a dome shape.

* * * * *